(12) United States Patent
Gadepally

(10) Patent No.: US 6,908,833 B1
(45) Date of Patent: Jun. 21, 2005

(54) SHALLOW SELF ISOLATED DOPED IMPLANTED SILICON PROCESS

(75) Inventor: Kamesh Gadepally, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 21 days.

(21) Appl. No.: 10/366,773

(22) Filed: Feb. 14, 2003

(51) Int. Cl.[7] .................. H01L 21/203; H01L 21/363
(52) U.S. Cl. .............. 438/479; 438/300; 438/303; 438/304; 438/305; 438/478
(58) Field of Search .............. 438/300, 303–305, 438/478–479, 491, 407, 488, 482, 486; 439/407, 488; 117/92, 94–95; 257/E21.147, E21.148, E21.149, E21.15, E21.151

(56) References Cited

U.S. PATENT DOCUMENTS

| | | | | |
|---|---|---|---|---|
| 4,771,247 A | * | 9/1988 | Jacomb-Hood | 330/277 |
| 4,843,034 A | * | 6/1989 | Herndon et al. | 438/622 |
| 5,087,589 A | * | 2/1992 | Chapman et al. | 438/467 |
| 5,352,895 A | * | 10/1994 | Inoue | 250/338.3 |
| 5,387,541 A | * | 2/1995 | Hodge et al. | 438/409 |
| 6,146,973 A | * | 11/2000 | He et al. | 438/433 |
| 6,225,666 B1 | | 5/2001 | Gadepally | 257/347 |
| 6,329,287 B1 | | 12/2001 | Gadepally | 438/674 |

OTHER PUBLICATIONS

S. Wolf and R.N. Tauber, "Silicon Processing for the VLSI Era", vol. 1—Process Technology, second edition (2000), Lattice Press, Sunset Beach, California (ISBN: 0 – 961672–6–1). In particular: pp. 378–385 and 393–394.*

F. Leisenberger et al, "A high resolution XPS study of a complex insulator: the case of porous silicon", Applied Surface Science vol. 108, pp. 273–281 (1997), Elsevier North–Holland Publishing Co.*

* cited by examiner

*Primary Examiner*—Nathan J. Flynn
*Assistant Examiner*—Johannes Mondt
(74) *Attorney, Agent, or Firm*—Stallman & Pollock LLP

(57) ABSTRACT

A process and structure for forming electrical devices. The process and structure provide for forming an insulating layer on a substrate. A conductive region is then formed in the insulating layer by implanting silicon atoms into the insulating layer. Further, a plurality of different conductive regions can be formed in the insulating layer. An electrical device such as a transistor or a diode can then be formed in each of the conductive regions. Because the conductive regions are formed in a conductive region which is largely electrically isolated from other conductive regions there is little possibility for adjacent devices to cause interference.

8 Claims, 4 Drawing Sheets

US 6,908,833 B1

SHALLOW SELF ISOLATED DOPED IMPLANTED SILICON PROCESS

TECHNICAL FIELD

The present invention relates to semiconductor device structures, particularly structures which provide conductive regions that are formed in an insulating layer.

BACKGROUND OF THE INVENTION

In the past semiconductor devices of integrated circuits were typically formed in a silicon substrate. As silicon devices such as transistors and diodes have become smaller, the frequency of operation for the integrated circuits has increased. This increase in frequency, and the decrease in the space separating devices has resulted in increased potential interference between adjacent semiconductor devices. For example, a current going through one device may result in a leakage of current to an adjacent device, which can disrupt the function of the adjacent device.

In order to reduce the potential for interference between neighboring devices in an integrated circuit, one common approach is to use shallow trench isolation techniques to form isolation trenches between adjacent devices. This technique requires the etching of trenches in the substrate and the forming of an insulting material such as an oxide, or a nitride, in the trench. In these prior approaches the trench is relatively shallow as compared with the substrate. Thus, it is possible for some electrical current to propagate under the bottom of the trench to an adjacent device, and to cause interference with the adjacent device.

Another prior technique provides for forming silicon semiconductor devices in a trench formed in an insulating layer formed on a silicon substrate. One such process is described in U.S. Pat. No. 6,225,666, issued May 1, 2001, entitled LOW STRESS ACTIVE AREA SILICON ISLAND STRUCTURE WITH NON-RECTANGULAR CROSS-SECTION PROFILE AND METHOD FOR ITS FORMATION, which is hereby incorporated by reference in its entirety. As shown in FIG. 1, hereto, the process described in the '666 patent provides for using different etching techniques to etch a trench having wine glass shaped lateral sides 110 in an insulating layer 104 formed on a silicon substrate 102. After the trench has been formed in the insulating layer an active silicon area 108 is formed on an exposed area 106 of the substrate 102, using an epitaxial process. Semiconductor devices can then be formed in the active silicon area 108 formed in the trench. This approach, however, requires both dry etching step and wet etching steps, which are then followed by an epitaxial process for forming an active silicon area 108 on the substrate 102. The process of forming the trench in the insulating layer and forming the active silicon area on the silicon substrate can increase the time associated with fabricating the semiconductor devices of the integrated circuits.

SUMMARY

One aspect of the invention herein is a method of forming a semiconductor electrical device. The method includes forming an insulating layer on a substrate, and implanting silicon atoms into the insulating layer to form a first region silicon atoms, wherein the first region extends from the top surface to the bottom surface of the insulating layer. Another aspect includes a method for forming a passive electrical device. The method for forming a passive electrical device includes forming an insulating layer on a substrate, wherein the insulating layer inhibits the flow of electricity, the insulating layer having a top surface and a bottom surface, wherein the bottom surface is proximate to the substrate, and the top surface is separated from the bottom surface by a first distance. The method also includes implanting silicon atoms into the insulating layer to form a first region silicon atoms, wherein the first region extends from the top surface to a second distance below the top surface. Another aspect of the invention herein is a passive electrical device for use in a semiconductor integrated circuit, the passive device including a silicon region implanted into an insulating material formed on a substrate, wherein the silicon region is of a polycrystalline structure.

The features and advantages of the present invention will be more fully appreciated upon consideration of the following detailed description of the invention and the accompanying drawings, which set forth an illustrative embodiment in which the principles of the invention are utilized.

DETAILED DESCRIPTION OF THE INVENTION

Figure 8:
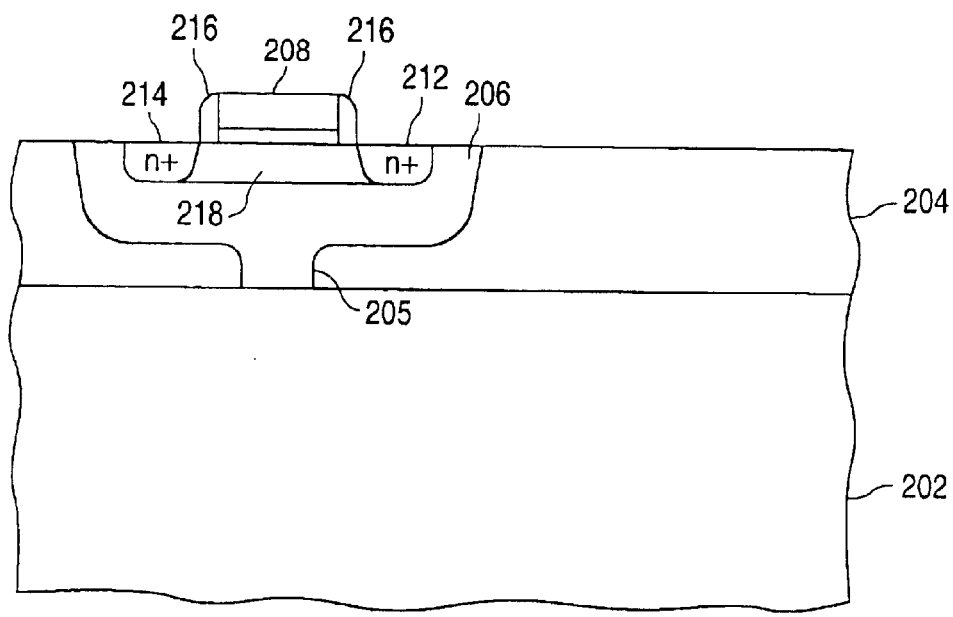
FIG. 8 is a view of forming spacers adjacent to the lateral sides of the gate, and forming n+ silicon regions, which form the source and drain for an NMOS transistor.

FIG. 8 shows a semiconductor device formed according to an embodiment of the present invention. The semiconductor device 220 shown in FIG. 8 is an NMOS transistor. Aspects of this device will be described in detail in connection with the figures herein which show steps in a process of an embodiment of the invention.

Figure 1:
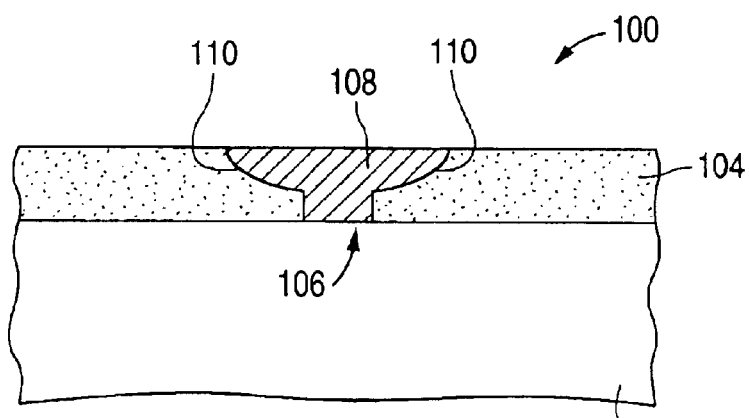
FIG. 1 is a view of an conductive silicon region formed on a silicon substrate according to the prior art.
Figure 2:
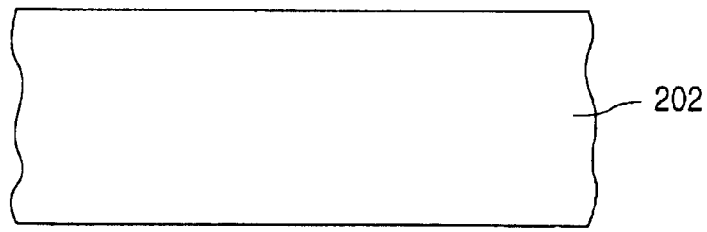
FIG. 2 is a view of a substrate which can be used in the process described herein.
Figure 3:
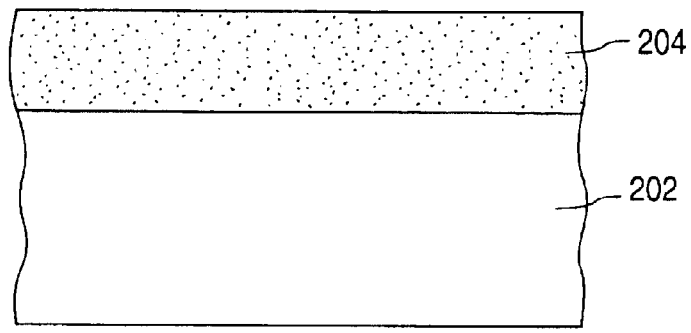
FIG. 3 is a view of an insulating layer formed on a substrate.

FIG. 2 shows a silicon substrate 202 used in forming semiconductor devices as is known in the art. FIG. 3 shows an insulating layer 204 formed on the substrate 202. The insulating layer 204 can be formed of any of number of different materials, including $SiO_2$, SiN, SiC, and a range of other insulating materials well known to those skilled in the art. The insulating layer 204 can be formed using any one of a number of known techniques including chemical vapor deposition, physical vapor deposition, thermal growth, or sputtering. In one embodiment the insulating layer will be approximately $1\mu$ thick, but in same cases this layer may be thicker or thinner depending on the techniques used, and the devices to be formed in the insulating layer 204.

Figure 4:
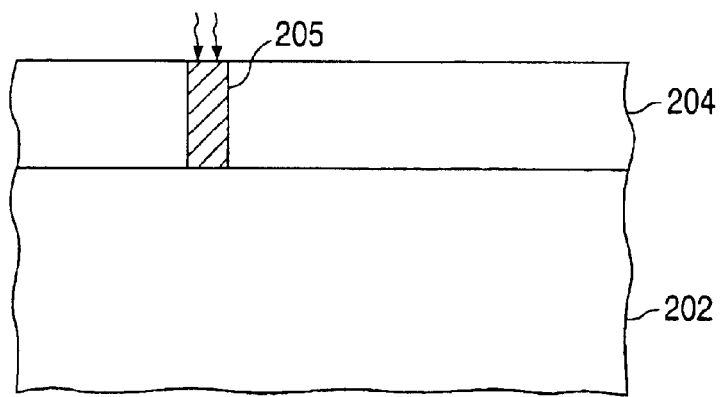
FIG. 4 is a view of a first silicon region formed in an insulating layer.
Figure 5:
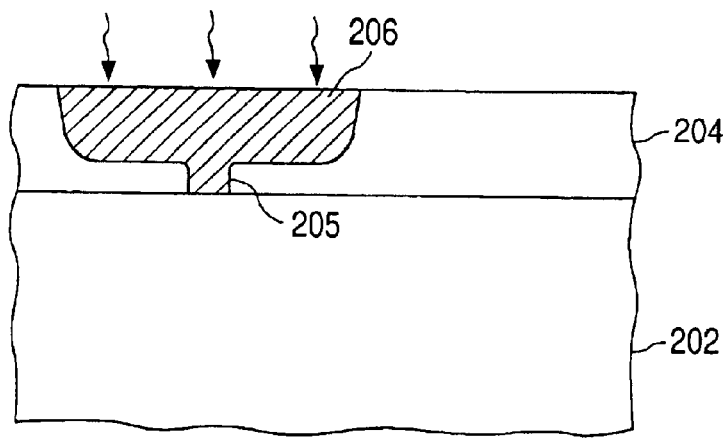
FIG. 5 is a view of forming of an expanded silicon region formed in the insulating layer, wherein the expanded silicon region has a first type conductivity.

FIGS. 4 and 5 show the formation of a silicon region 205 and 206 in the insulating layer 204. While the techniques and steps discussed here in connection with FIGS. 2–8 are discussed in connection with forming an NMOS transistor 220 as shown in FIG. 8, it should be recognized that these steps are intended to be illustrative, and it should be recognized that with modification of the materials used to create a regions 205 and 206 a number of other types of devices such as diodes, photodiodes, PMOS transistors, and LEDs, for example, could be formed using the structure and process described herein.

In the context of the discussion herein "conductive " and "conducting " is used to distinguish the regions 205 and 206 from the insulating layer 204. As is understood in the art, regions of silicon or other material such as silicon/germanium, particularly where it has been doped, can form a material which is conductive relative to an insulating material such as an oxide or a nitride, as is commonly used for forming insulating regions. The conductive region, as discussed herein, may be a region which can be made more or less conductive by applying a voltage to a gate of a transistor, where different types of conductive regions, such as p-type silicon and n+ type silicon are used to form regions of NMOS transistor. Thus, a region of a conducting material may, in the case of an active semiconductor device such as a transistor, also be referred to as an active region, or a semiconductor region. Thus, for purposes of the discussion herein the terms conductive and conducting are applicable to describing the selectively conducting region of a semiconductor device, as well as a conducting region of a passive device such as a capacitor, inductor, or resistor. Further, given the context of the use of the terms conducting and conducting, as set forth herein, the meaning of the term conductive will be illustrated.

FIG. 4 shows a step of implanting silicon into the insulating layer. The implantation of the silicon atoms into the insulating layer can be achieved using known implantation techniques. These procedures would typically include using mask (not shown) formed on the surface of the insulating layer to select an area on the surface of the insulating layer where atoms will be implanted into the insulating layer 204. This photolithographic process used in conjunction with forming the mask for implanting silicon to form the region 205 can be a non-critical masking process utilizing I-line photoresist, which has lower resolution, and is less expensive than a critical masking process which uses a deep UV photoresist.

Following implantation of silicon to form region 205, the mask would be removed and second masked is formed on the surface of the insulation layer 204. This mask defines a second area on the surface of the insulating layer, which corresponds to the upper surface of the region 206 shown in FIG. 5. Silicon atoms are then implanted into the insulating layer 204 to form the region 206. The implantation of ions to form regions 205 and 206 creates a silicon saturated area in the insulating layer. In a situation where the thickness of the insulating layer is $1\mu$, then the energy used to implant silicon atoms into region 205 will need to be sufficient to cause the silicon atoms to penetrate through the $1\mu$ layer of insulating material such that a continuous silicon region is formed from the top of the insulating layer 204 to the top of the underlying substrate 202. For the implantation of silicon atoms to form the region 206, the energy to implant the silicon atoms is reduced so that the implanted atoms will not penetrate through the insulating layer 204 to the substrate 202. In one embodiment it is beneficial to form the region 205 such that its width is as narrow as possible (so as to reduce the possibility of current leaking through the substrate to a neighboring device) but still wide enough to provide a seed area for the formation a silicon crystal in area 205 and 206. In one embodiment this width is in the range of $0.25\mu$. The depth of the region 206 from the top surface of the insulating layer 204 to the bottom of the region 206 is in the range of $0.25$–$0.8\mu$ where the thickness of the insulating layer is in the range of $1\mu$. The goal is to keep a sufficient amount of insulating material between the bottom of the region 206 and the substrate, so as to minimize leakage of current from one device to an adjacent device.

The implantation of silicon in the insulating layer 204 can be achieved using known implantation techniques. In one embodiment the silicon atoms can be implanted into the insulating layer, and then an additional implantation process is used to dope the region 206 with atoms to cause the region to be of p- silicon conductivity type. Another alternative is to implant the region with pre-doped silicon, where the silicon atoms are implanted into the region 206 at the same time as the p- type atoms. As is known in the art, Boron is one type of material which is frequently used to dope silicon to create p- type silicon.

The implanter used to implant the atoms into the insulating layer 204 should be able to provide accurate control as to the amount of energy which is used to drive the silicon atoms into the areas 205 and 206. Varian Semiconductor Equipment Associates, Inc. is an example of a supplier of ion implantation systems. The Kestrel 750 (High Energy) ion implanter from Varian is suitable ion implanter. The range of energy used to drive the silicon into the insulating layer 204 must be controlled so as to ensure that the silicon atoms penetrate to the desired depths (as discussed above) in the insulating layer. Depending on the thickness of the insulating layer 204 and the desired depths of the silicon in the insulating layer, appropriate energy levels for the ion implantation can be in the range of 2 kev to 2 Mev. Further, the density of the silicon implanted in the insulating layer should be high enough that the characteristics of the silicon overwhelm the characteristics of the insulating layer. Indeed, much of the insulating layer may be displaced as a result of the density of silicon implanted into the insulating layer 204. The density of the silicon can vary over a large range from $2\times10^8$ to $2\times10^{15}$ atoms/cm$^3$.

Once regions 205 and 206 have been formed in the silicon region is annealed so that it forms a crystalline structure suitable for forming a conductive region for a semiconductor device. Where an active device such as an NMOS transistor is to be formed in the region 206, the silicon region will need to be heated at a sufficient temperature for a sufficient amount of time so that the silicon will be a generally single crystalline structure. The bottom of region 205 which is in contact with the underlying silicon substrate acts as seed layer for forming a crystalline structure through out the regions 205 and 206. One suitable annealing process provides for heating the region to approximately 1200 degrees Celsius for approximately 2 hours. Following this process the regions 205 and 206 will form a generally single crystalline structure.

Figure 6:
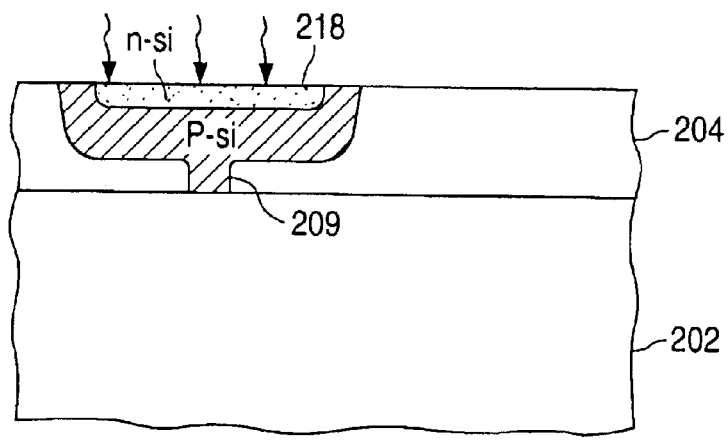
FIG. 6 is a view of forming an area in the conductive region such that it is of a second conductivity type, which is different than the first conductivity type.

In one embodiment after the annealing process above, the silicon regions 205 and 206, shown collectively as region 209 in FIG. 6 are implanted with atoms so that the region will be p- type silicon conductivity. As is known in the art Boron is a suitable atom for forming p-type silicon. Again the energy level of implantation must be controlled, and the amount Boron must also be controlled so that the Boron will be disposed throughout the region 206. In another embodiment, as discussed above, the Boron could be implanted into the region 206 at the same time as the silicon implantation.

FIG. 6 shows the process of implanting additional atoms into the conductive region 209. These atoms create a region 218 in the conductive region 209 where the conductivity of the region 218 will be n-type silicon, instead of p-type Silicon. Suitable atoms for implantation to create an n- type region include Phosphorous and Arsenic. The energy used to implant the n- atoms to create the region 218 is controlled so that the depth which the atoms penetrate into the region 209 will be significantly less than the total depth of the region 206. For example, the depth of region 218 could be about $0.1\mu$, where the depth of the insulating layer is about $1\mu$ and the depth of the conductive region 209 is about $0.5\mu$.

Figure 7:
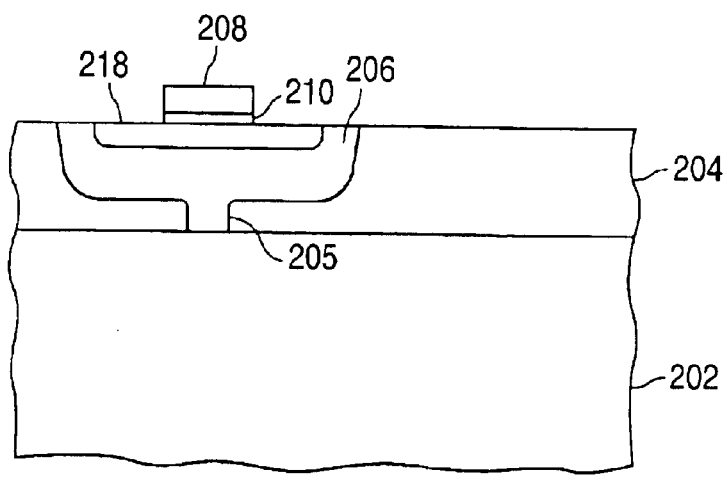
FIG. 7 is a view of forming a gate oxide layer, and a gate, above the conductive region.

As shown in FIG. 7 after the n-type region 218 has been formed, a gate oxide layer 210 can be formed over part of the region 218. This gate oxide layer can be formed using well known techniques for forming gate oxides for NMOS type devices. A gate is then formed over the gate oxide layer 210. The gate 208 will typically be of polysilicon as is known for NMOS type devices.

FIG. 8 shows the formation of spacers 216 on the lateral sides of the gate 208. After the formation of the spacers 216, n+ atoms are implanted in regions 214 and 212 to form a source and drain of the NMOS transistor. Electrode contacts (not shown) would be electrically coupled to the source 214 and drain 212 and to the gate 208.

Figure 9:
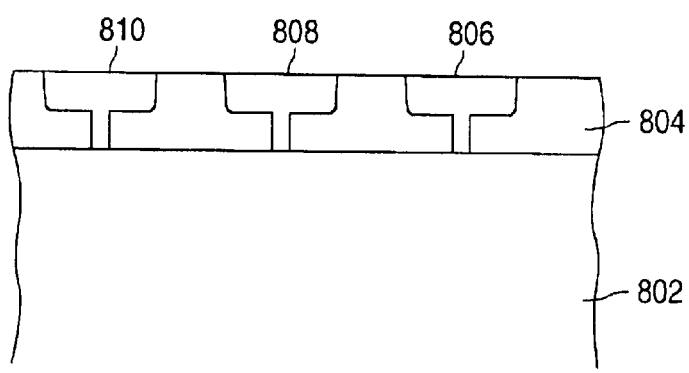
FIG. 9 shows a number of different conductive regions formed in an insulating layer.

The process described above has been discussed in the context of forming an NMOS transistor but the process can be used in a similar manner to form a number of other devices in an insulating material formed on a substrate. For example, it should be recognized that the conductive region 209 could be formed using other materials which can form an active region for different semiconductor devices. For example, FIG. 9 shows a cross sectional view of a substrate, 802, having an insulating layer 804 formed thereon. Region 810 is a conductive region formed of silicon/germanium. Region 808 is a conductive region formed of silicon/boron, and conductive region 806 is formed of silicon/phosphorus. Each of these conductive regions is formed using the implantation techniques similar to those discussed above, and can be used to form different semiconductor devices, such as transistors or diodes. As shown in the embodiment of FIG. 9, the conductive regions 810, 808 and 806 for different devices of a circuit are electrically isolated from each other.

Figure 10A:
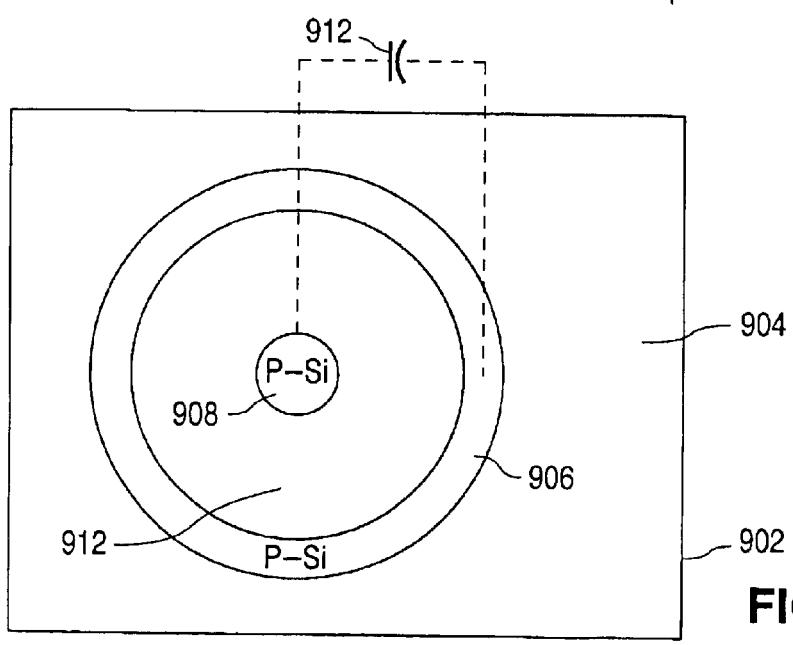
FIG. 10A–B shows a capacitive device formed in an insulating layer.
Figure 10B:
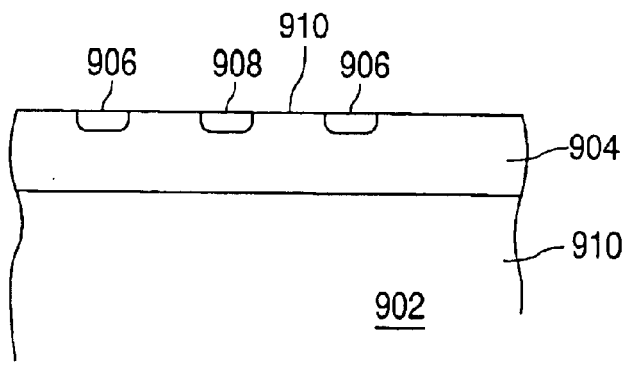

The process and structure described herein can, with some modification, also be used to form passive devices such as capacitors, inductors, and resistors. FIGS. 10 A–B shows a capacitor formed according to the present invention. FIG. 10A shows a plan view looking down on the top of the device 902. FIG. 10B shows a cross sectional view taken through the center of region 908. Region 904 is the insulating layer, which can be formed on SiO$_2$, or other material as discussed above. The insulating layer 904 is formed on an underlying substrate 910. Region 906 shows a conductive region, which can be of p-silicon type conductivity, or other conductive material. Similarly, region 908 is also formed of conductive material such as p-silicon. Region 912 is of the insulation material which is formed on an underlying substrate 902. The capacitor symbol 912 is shown for illustrative purposes, and corresponds to the conductive regions 906 and 908 separated by an insulator 910. It should be recognized that the capacitive structure shown in FIG. 10A is illustrative, and could be formed using a number of other structures with provide for two conductive regions separated by an insulating region. For example, another type of structure for a capacitor includes two generally parallel conductive regions separated by an insulating region.

As shown in FIGS. 10A–B the conductive regions 906 and 908 are formed using implantation processes similar to that described above in connections with FIGS. 2–8. However, the energy used to implant the silicon atoms and any dopant atoms is controlled so that the atoms only penetrate through part of the insulating layer and do not reach the underlying substrate 910. An annealing process is used to form a polycrystalline structure in the regions 910 and 906. Because a polycrystalline structure can be used for passive devices such as inductors, capacitors and resistors, it is not necessary to form region which is contiguous with the underlying substrate, and can be used as a seed area for forming single crystal, as described above in connection with forming an NMOS transistor.

Figure 11:
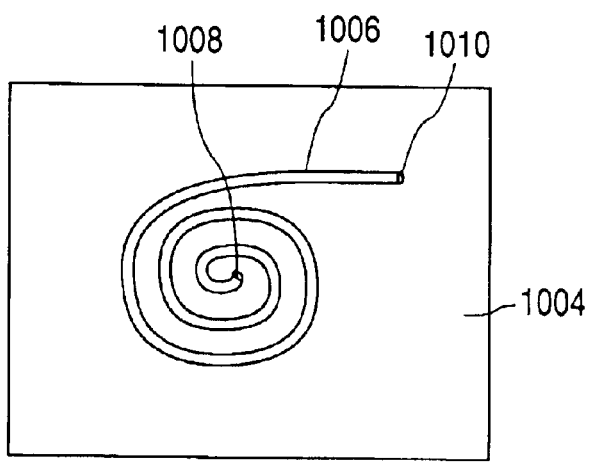
FIG. 11 shows an inductive device formed in an insulating layer.
Figure 12:
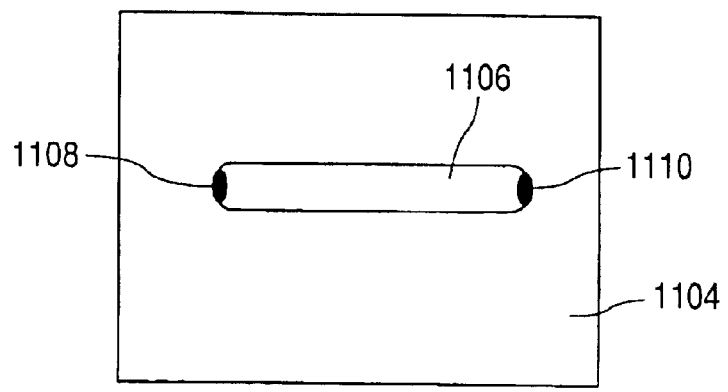
FIG. 12 shows resistive device formed in an insulating layer.

FIG. 11 shows a top plan view of an inductor formed using the process and structure described herein. Area 1004 shows an insulating layer formed on a substrate. Area 1006 shows a conductive region having spiral shape. Contacts (not shown) would be coupled to point 1008 and to point 1010. The conductive region 1006 between the points 1008 and 1010 forms an inductor. FIG. 12 shows a resistor formed using the process and structure described herein. Area 1104 shows an insulating material formed on a substrate. Area 1106 shows a conductive region. A contact would be coupled to the point 1110 and another contact would be coupled to point 1108. The conductive region 1106 between points 1110 and 1108 forms the resistor, where the properties of the resistor are controlled by the composition of the material formed in the conductive region. For example the resistivity of the region 1106 could be increased or decreased by increasing or decreasing the amount of carrier dopant incorporated into silicon disposed in the region 1106. The resistivity of the region 1106 could also be increased or decreased by controlling the width, depth and length of the region 1106. For example, a longer 1106 would have higher resistivity than a shorter region. Further, the larger the cross section the less resistivity provided by the device.

Although specific embodiments and methods of the present invention are shown and described herein, this invention is not to be limited by these methods and embodiments. Rather, the scope of the invention is to be defined by the following claims and their equivalents.

What is claimed is:

1. A method of forming a semiconductor electrical device, comprising:

forming an insulating layer on a substrate, wherein the insulating layer inhibits the flow of electricity, the insulating layer having a top surface and a bottom surface, wherein the bottom surface is proximate to the substrate, and the top surface is separated from the bottom surface by a first distance;

implanting silicon atoms into the insulating layer to form a first region of silicon atoms, wherein the first region extends from the top surface to the bottom surface of the insulating layer, and wherein the region has a first width; and implanting silicon atoms into the insulating layer to form a second region of silicon atoms, where the second region extends from the top surface of the insulating layer to a second distance, which is less than the first distance separating the top and the bottom of the insulating layer, and wherein the second region has a width which is greater than the first width.

2. The method of claim 1, wherein a center region of the first region is proximate to a center region of the second region.

3. The method of claim 1, further includes annealing the silicon atoms in the first and second regions.

4. The method of claim 1, further including annealing the silicon atoms implanted into the insulating layer, wherein the bottom of the first region and the substrate form a seed area, whereby during the annealing of the silicon atoms, the seed area serves for forming a single crystalline structure, wherein the single crystalline structure includes the silicon atoms implanted during the implanting to form the first region, and the silicon atoms implanted during the implanting to form the second region.

5. The method of claim 1, wherein the first distance is approximately 1 $\mu$m, and the second distance is in the range of 0.25 to 0.80 $\mu$m.

6. The method of claim 1, further including implanting a first type of atoms into the first and second regions to form p-type silicon.

7. The method of claim 6, further including implanting a second type of atoms into the first and second regions to form an n-channel region.

8. The method of claim 7, further including forming a source and drain region in the second region, and forming a gate oxide layer over the channel region, and forming a gate over the gate oxide layer.

* * * * *